(12) United States Patent
Schueffelgen et al.

(10) Patent No.: US 11,088,312 B2
(45) Date of Patent: Aug. 10, 2021

(54) METHOD FOR THE IN SITU PRODUCTION OF MAJORANA MATERIAL SUPERCONDUCTOR HYBRID NETWORKS AND TO A HYBRID STRUCTURE WHICH IS PRODUCED USING THE METHOD

(71) Applicant: FORSCHUNGSZENTRUM JUELICH GMBH, Juelich (DE)

(72) Inventors: Peter Schueffelgen, Cologne (DE); Daniel Rosenbach, Juelich (DE); Detlev Gruetzmacher, Niederzier (DE); Thomas Schaepers, Aachen (DE)

(73) Assignee: FORSCHUNGSZENTRUM JUELICH GMBH, Juelich (DE)

( * ) Notice: Subject to any disclaimer, the term of this patent is extended or adjusted under 35 U.S.C. 154(b) by 0 days.

(21) Appl. No.: 16/486,848

(22) PCT Filed: Mar. 1, 2018

(86) PCT No.: PCT/DE2018/000048
§ 371 (c)(1),
(2) Date: Aug. 19, 2019

(87) PCT Pub. No.: WO2018/171823
PCT Pub. Date: Sep. 27, 2018

(65) Prior Publication Data
US 2020/0044137 A1 Feb. 6, 2020

(30) Foreign Application Priority Data
Mar. 20, 2017 (DE) .................... 10 2017 002 616.5

(51) Int. Cl.
*H01L 39/24* (2006.01)
*G06N 10/00* (2019.01)
(Continued)

(52) U.S. Cl.
CPC ......... *H01L 39/2493* (2013.01); *G06N 10/00* (2019.01); *H01L 39/025* (2013.01); *H01L 39/08* (2013.01); *H01L 39/223* (2013.01)

(58) Field of Classification Search
CPC .................................................. H01L 39/2493
See application file for complete search history.

(56) References Cited

U.S. PATENT DOCUMENTS

| 5,641,611 A | 6/1997 | Lee et al. |
| 2005/0250344 A1 | 11/2005 | Kersch et al. |

(Continued)

FOREIGN PATENT DOCUMENTS

| DE | 69628520 T2 | 12/2003 |
| DE | 10249207 A1 | 5/2004 |

OTHER PUBLICATIONS

Rohkinson, et al.: "The Fractional a.c. Josephson Effect in a Semiconductor-Superconductor Nanowire as a Signature of Majorana Particles", *Nature Physics* 8, 11: 1-9 (Sep. 23, 2012), XP055480252.

(Continued)

*Primary Examiner* — Yu-Hsi D Sun
(74) *Attorney, Agent, or Firm* — Leydig, Voit & Mayer, Ltd.

(57) ABSTRACT

A method for producing a hybrid structure, the hybrid structure including at least one structured Majorana material and at least one structured superconductive material arranged thereon includes producing, on a substrate, a first mask for structured application of the Majorana material and a further mask for structured growth of the at least one superconductive material, which are aligned relatively to one another, and applying the at least one structured superconductive material to the structured Majorana material with the aid of the further mask. The structured application of the Majorana material and of the at least one superconductive (Continued)

material takes place without interruption in an inert atmosphere.

15 Claims, 8 Drawing Sheets

(51) Int. Cl.
   *H01L 39/02* (2006.01)
   *H01L 39/08* (2006.01)
   *H01L 39/22* (2006.01)

(56) References Cited

U.S. PATENT DOCUMENTS

| | | | |
|---|---|---|---|
| 2016/0035470 A1 | 2/2016 | Yazdani et al. | |
| 2019/0013457 A1* | 1/2019 | Lutchyn | H03K 3/38 |
| 2019/0131513 A1* | 5/2019 | Krogstrup | C30B 29/02 |
| 2020/0287120 A1* | 9/2020 | Pikulin | H01L 21/02639 |

OTHER PUBLICATIONS

Rohkinson, et al.: "The Fractional a.c. Josephson Effect in a Semiconductor-Superconductor Nanowire as a Signature of Majorana Particles", *Nature Physics* 8, 11: 795-799 (Sep. 23, 2012), XP055187267.
Pang, et al.: "Spatially Resolved Gap Closing in Single Josephson Junctions Constructed on Bi 2 Te 3 Surface", *Chinese Physics B* 25, 11: 117402 (Nov. 1, 2016), XP055480506.
Mourik, et al.: "Signatures of Majorana Nanowire Devices", *Science* 336, 6084:1003-1007 (May 25, 2012), XP055150634.
Zhang, et al.: "Ballistic Majorana Nanowire Devices", (Mar. 13, 2016), XP080689354.
Shabani, et al.: "Two-Dimensional Epitaxial Superconductor-Semiconductor Heterostructures: A Platform for Topological Superconducting Networks", *Physical Review B* 93, 15 (Apr. 1, 2016), XP055458738.
Mulcahy: "The Superconducting Proximity Effect in Bi2Se3 Thin-Films": 24-35 (Jan. 1, 2015), XP055480266.
Kampmeier, et al.: "Selective Area Growth of Bi2Te3 and Sb2Te3 Topological Insulator Thin Films", *Journal of Crystal Growth* 443: 38-42 (Mar. 11, 2016).
Joern Kampmeier, et al., "Selective area growth of $Bi_2Te_3$ and $Sb_2Te_3$ topological insulator thin films", Journal of Crystal Growth 443, Mar. 6, 2016, pp. 38-42.
A. Yu Kitaev, "Unpaired Majorana fermions in quantum wires", Chernogolovka 2000: Mesoscopic and strongly correlated electron systems, Dec. 2001, pp. 131-132.
Sergio Boixo, et al., "Characterizing Quantum Supremacy in Near. Term Devices", arXiv:1608.00263v3 [quant-ph], Apr. 5, 2017, pp. 1-23.
Jun Chen, et al., "Experimental Phase Diagram of a One-Dimensional Topo-logical Superconductor", arXiv:1610.04555v1 [cond-mat.mes-hall], Oct. 14, 2016, pp. 1-40.
T. Hoss, et al., "Nonorganic evaporation mask for superconducting nanodevices", Microelectronic Engineering 46, Dec. 1999, pp. 149-152.
P. Krogstrup, et al., "Epitaxy of semiconductor-superconductor nanowires", Nature Materials, vol. 14, Apr. 2015, pp. 400-406.
V. Mourik, et al., "Signatures of Majorana Fermions in Hybrid Superconductor-Semiconductor Nanowire Devices", Science, vol. 336, May 25, 2012, pp. 1003-1007.
Hao-Hua Sun, et al., "Majorana Zero Mode Detected with Spin Selective Andreev Reflection in the Vortex of a Topological Superconductor", Physical Review Letters 116, Jun. 24, 2016, pp. 257003-1-257003-5.
O. Vazquez-Mena, et al., „Resistless nanofabrication by stencil lithography: A review, Microelectronic Engineering 132, Aug. 17, 2014, pp. 236-254.
J. Wiedenmann, et al., "4π-periodic Josephson supercurrent in HgTe-based topological Josephson junctions", Nature Communications, Jan. 21, 2016, pp. 1-7.

\* cited by examiner

G1

G2 (var. A)

G2 (var. B)

METHOD FOR THE IN SITU PRODUCTION OF MAJORANA MATERIAL SUPERCONDUCTOR HYBRID NETWORKS AND TO A HYBRID STRUCTURE WHICH IS PRODUCED USING THE METHOD

CROSS REFERENCE TO RELATED APPLICATIONS

This application is a U.S. National Phase Application under 35 U.S.C. § 371 of International Application No. PCT/DE2018/000048, filed on Mar. 1, 2018, and claims benefit to German Patent Application No. DE 10 2017 002 616.5, filed on Mar. 20, 2017. The International Application was published in German on Sep. 27, 2018 as WO 2018/171823 under PCT Article 21(2).

FIELD

The invention relates to a method for producing a device which makes it possible to deposit superconductive and Majorana materials in various geometries and dimensions and in precise alignment to each other except for a few nanometers, doing so in an inert atmosphere and preferably in an ultra-high vacuum and to preserve them with a passivating protective layer. Complex networks of said materials can be fabricated with the device. These networks include as the smallest subunit a hybrid structure, such as a topological Josephson contact but in a further embodiment may represent up to a plurality of topological quantum bits. The method preserves the surface properties of the Majorana material and a high interface quality between the Majorana material and the superconductor.

BACKGROUND

In order to represent bits, distinguishable physical states must be present, which are defined in traditional transistor technology by two distinguishable voltage values. In the case of a quantum computer, these states are represented by distinguishable quantum-mechanical states. Such a quantum computer is characterized by a large number, in extreme cases by an arbitrarily large number, of distinguishable states which represent the bits, the so-called quantum bits (qubits). For this reason, certain calculations can be solved much more quickly and efficiently on a quantum computer. Thus, Google showed in January 2016 that they could solve a problem approximately 100,000,000 times faster with their D-Wave quantum annealer than with a traditional computer. A quantum annealer is a special type of quantum computer, which can however only be used for optimization problems. The total computing power made possible by quantum mechanics only becomes apparent in a so-called universal quantum computer. The main problem of universal quantum computers is that the very sensitive and short-lived quantum states are not stable and simply reading these states can result in a change of state. The errors resulting therefrom must be corrected immediately after each computation step. This error correction is the reason why development of a universal quantum computer is only proceeding slowly and why during the last 30 years it has not been possible to realize a universal quantum computer with a two-digit number of qubits. In the field of error-corrected quantum computing, Google also reached a milestone at the beginning of 2016 and built to date the most powerful error-corrected universal quantum computer. Unlike the 1000 qubits of the D-Wave 2X quantum annealer, only 8 qubits are implemented in this case. IBM has also developed a first universal quantum computer with five qubits, which has even been made available to the public within the framework of Quantum Experience since May 2016. However, at least 50 qubits are required in order to perform computations that currently cannot be solved even by modern supercomputers [1].

In order to achieve the goal of a quantum computer with 50 qubits as quickly as possible, scientific and industrial institutions are focusing on a relatively young sector of quantum computing, so-called topological quantum computing. The fact that in theory no error correction is required for this type of quantum computer, and only a very small degree of error correction in practice, makes this approach particularly promising and brings the arrival of a 50-qubit machine into the near future.

As in conventional (non-topological) quantum computers, quantum objects or particles (objects, particles or quasiparticles that follow the laws of quantum mechanics) must also be actively integrated into the calculation process in topological quantum computers and to this end be positioned on a chip, separately controlled, manipulated and read out. The quantum-mechanical quasiparticle, on the basis of which the topological quantum computer computes, is the so-called bound Majorana zero mode (MZM). MZMs are 0-dimensional quasiparticle excitations that promise new concepts for more error-tolerant quantum computing due to their non-Abelian commutation relations.

MZMs can arise when connecting so-called Majorana materials to superconductive materials. In this document all materials in which Majorana zero modes are produced as soon as these materials are brought into contact with a superconductor and the fields (E field and B field) necessary for generating the MZMs are applied are referred to as Majorana materials. Majorana materials are, for example, Dirac materials, which in turn can be classified into topological insulators and Weyl metals by way of example, as well as "half-metals" which are not to be confused with semimetals, as well as III-V semiconductor nanowires. Majorana materials necessarily have fermionic states that do not have any spin degree of freedom (in the English language and in the further course of this document, these states are called "spinless fermions"). In a subset of Majorana materials, so-called topological insulators (TIs), the spin-path interaction in the solid, for example, results in the direction of spin for fermionic states at the surface of the TIs being directly coupled to the k vector in the momentum space. If superconduction is induced in such a spinless-fermions system, MZMs will arise under suitable circumstances (spatial geometry of the Majorana material, E and B fields).

Signatures of MZMs were demonstrated in InAs nanowires for the first time in 2012 by the group around Leo Kouwenhoven [3] and subsequently demonstrated in other material systems as well. Majorana zero modes in principle always arise in pairs, and in the case of 1D structures, the two modes appear locally separately at the two ends of the 1D structure in the form of 0D excitations. Together, the two Majoranas form a fermionic state. This state can either be occupied by an electron or unoccupied. In order to find out whether or not an electron is present in the two Majoranas, the two Majoranas must be moved towards each other. As soon as they "touch" or their wave functions overlap, they fuse into an electron or they are annihilated and no electron is produced.

The two states of "no electron" and "an electron" form the two eigenstates of the Majorana pair, or of the Majorana qubit, analogous to the eigenstates of "spin-up" and "spin-down" of a conventional spin qubit.

A fundamental difference from conventional qubits is that both eigenstates of Majorana qubits have the same energy, i.e. are degenerate. In conventional qubits, there is always an excited state and a ground state. If the qubit remains in the excited state for too long, it relaxes to the ground state and the information is lost. This cannot happen with the Majorana qubit. These and other properties result in Majorana qubits theoretically not requiring any error correction [2]. This fact significantly reduces the technological effort for a 50-qubit machine and makes the concept of topological quantum computing so attractive.

In order to do quantum computing with Majoranas, that is, to change the state of one or more qubits, these 0-dimensional objects must be arranged in a two-dimensional plane. It is also important that they can be moved around each other and towards each other. In particular, the quantum-mechanical state of a 2-Majorana system is changed by rotating the two Majoranas around each other. If a system is initialized in the state |0>(=no electron) and the two Majoranas are subsequently rotated around each other by 360°, the state will be changed to |1>. If the two Majoranas are now allowed to fuse together, an electron will be measured 100% of the time and an unoccupied state 0% of the time. The probability of measuring an electron is 50% in the case of a 180° rotation around each other, but only 25% in the case of a 90° rotation, and so on.

In principle, a topological quantum computer thus consists of a certain number of Majoranas which are arranged in a plane and which can be purposefully rotated around each other (or braided). The possibilities of the braiding operations and thus the performance of the quantum computer increase with the number of Majoranas. The challenge is to arrange (quasi-) 1D structures or nanowires in such a way that the Majorana modes can be moved according to requirements.

There are various approaches to generating Majorana modes and producing the first networks based thereon. The first signatures of Majorana modes were demonstrated in 2012 in InAs nanowires [2]. Based on these and similar concepts, intensive research is being conducted with the goal of building the first Majorana qubits soon. For example, US 2016/0035470 A1 discloses a magnetic topological nanowire structure comprising a superconductor and a quasi-1D magnetic nanowire. The quasi-1D magnetic nanowire is coupled to or embedded in the superconductor in order to produce a self-contained interaction resulting in a spatially separated pair of Majorana fermions.

The approach of constructing Majorana qubits from individual semiconductor nanowires has two decisive disadvantages. On the one hand, a relatively strong magnetic field is required in these nanowires for the topological phase to be reached. Only in this phase can Majorana modes be generated [4]. Furthermore, in order to build qubits from semiconductor nanowires, the individual nanowires must be aligned relatively to one another with nanometer precision. Whether working with individual nanowires or with networks of grown nanowires, the scaling of this approach requires an enormous amount of effort.

Some Majorana materials, such as topological insulators, inherently have the required topological properties. In this case, only the chemical potential must lie within the intrinsic bulk-energy gap for Majorana physics to be possible in practice. In 2016, signatures of Majorana modes in topological insulators were found for the first time in two independent experiments. If the spatial dimensions of the topological insulator are to be limited such that an energy gap results within the dispersion of the surface states, it is also necessary to apply a magnetic field/magnetic flux through the structure. This magnetic field is very small relative to the necessary magnetic fields for Zeeman splitting of the Rashba bands in InAs nanowires. The characteristic size here is half of a magnetic flux quantum, which, in the dimensions used in the text below, corresponds to a magnetic field of no more than 150 mT [5, 6].

In addition to the decisive advantage that no magnetic field is required for generating the topological phase in these materials, there is a further advantage:

Certain topological insulators, such as $(Bi_{(1-x)}Sb_x)_2Te_3$ where $0 \leq x \leq 1$, grow selectively [e.g., on Si (111) with respect to $SiO_2$ or $Si_3N_4$] [7]. Prior to their growth, preliminary structures can be defined without much effort in a very extensive and complex manner by optical or electron beam lithography. This technique makes it possible to realize complex geometries in a very short time.

In the case of topological insulators, the spinless fermions in Majorana materials are located at the surface of the solid. If the surface of the topological insulator is exposed to the ambient air outside an inert environment, the oxidation which then takes place will cause the Dirac states—as the system of spinless fermions in the surface of a topological insulator is termed—and thus surface transportation to be disturbed. It was found that a passivation layer for protecting the topological insulator from oxidation or degradation of the surface states can still be arranged on a topological insulator in the inert atmosphere, in particular in the ultrahigh vacuum ($p \leq 1 \times 10^{-7}$ mbar, preferably $p \leq 1 \times 10^{-8}$ mbar). The surface states can thereby be retained. A thin layer of aluminum of approximately 2 nm layer thickness, which can completely oxidize and thereby protects the topological insulator, can, for example, be used as a passivation layer. Alternatively, Te, Se and other insulating layers are also already used as passivation layers. It is therefore important to seal the entire surface of the topological insulator before it is outwardly transferred from the inert atmosphere and where applicable the ultrahigh vacuum and to thus preserve the surface states for Majorana physics. An inert atmosphere refers to an atmosphere which, in a manner adapted to the (Majorana) material, prevents any (chemical) reaction of the atoms and molecules in the atmosphere with the surface of the material.

In order for Majorana modes to arise, a superconductor must also be present as a second prerequisite in addition to the topological phase. Two superconductive contacts, which are separated by a small distance (5-150 nm) and which are connected by a material which is inherently not superconductive but becomes superconductive in the region between the contacts at low temperatures as a result of the presence of the superconductors, are referred to as a Josephson junction. If the "inherently non-superconductive" material is a Majorana material, the Josephson junction is called a topological Josephson junction. The Josephson junction is one of the simplest hybrid components, consisting of superconductor and Majorana material, and the basic component for many more complex components.

It is known from the prior art to apply superconductive Josephson contacts ex situ. For this purpose, the Majorana material, or more specifically the topological insulator, may first be deposited via a vacuum-based coating method or thin-film technology (physical vapor deposition (PVD), chemical vapor deposition (CVD), advantageously molecular beam epitaxy (MBE)). The superconductive contacts can then be subsequently defined by electron beam lithography (EBL) in a resist suitable for this purpose and can afterwards be vapor-deposited or sputter-deposited in another system. If the topological insulator has been sealed with a capping (passivation), this capping must be removed immediately prior to deposition of the superconductor, since the superconductor must be in direct contact with the Majorana material. In such a procedure, the risk routinely exists that the surface of the Majorana material will already oxidize or react with the ambient air before the superconductive material is applied. This leads, for example, to defects and to amorphizing surface regions, i.e. to an interface between the Majorana material and the superconductor encumbered with imperfections and unevennesses. These have a disadvantageous effect as tunnel barriers. Such interfaces are generally not suitable for the practice of Majorana physics.

For other material systems, such as InAs, it is furthermore known to apply in situ a homogeneous layer of superconductive material, in particular aluminum, to thin films [8]. The superconductive materials are subsequently chemically and/or physically structured. This is done by removing subregions of the superconductive layer.

By applying the superconductive materials without leaving the inert atmosphere and in particular the ultrahigh vacuum, an interface of very high quality can be created between the Majorana material (or the topological insulator) and the superconductor. Disadvantageously, the removal of subregions of the superconductive layer also always leads to a change in or destruction of the surface of the underlying material. This leads to a chemical change in the surface, in particular when topological insulators are used.

A nanometer-precise removal of a superconductive layer arranged on a Majorana material and a subsequent local oxidation of this region is generally not possible because of the surface properties of the superconductor. In the case of aluminum, the surface of the aluminum would regularly also be too rough.

Known from the prior art is so-called stencil lithography. This technology enables subregions of a substrate or thin film to be provided with a second structured layer (in situ) by means of a shadow mask (hard mask) [9, 10]. The use of hard masks makes it possible to structure a second, for example a superconductive, layer within the inert atmosphere and advantageously in the ultrahigh vacuum. Structuring is carried out in this case in systems with partially directed material flow by reproducing the structures defined on the hard mask.

SUMMARY

In an embodiment, the present invention provides a method for producing a hybrid structure, the hybrid structure including at least one structured Majorana material and at least one structured superconductive material arranged thereon. The method includes producing, on a substrate, a first mask for structured application of the Majorana material and a further mask for structured growth of the at least one superconductive material, which are aligned relatively to one another, and applying the at least one structured superconductive material to the structured Majorana material with the aid of the further mask. The structured application of the Majorana material and of the at least one superconductive material takes place without interruption in an inert atmosphere.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
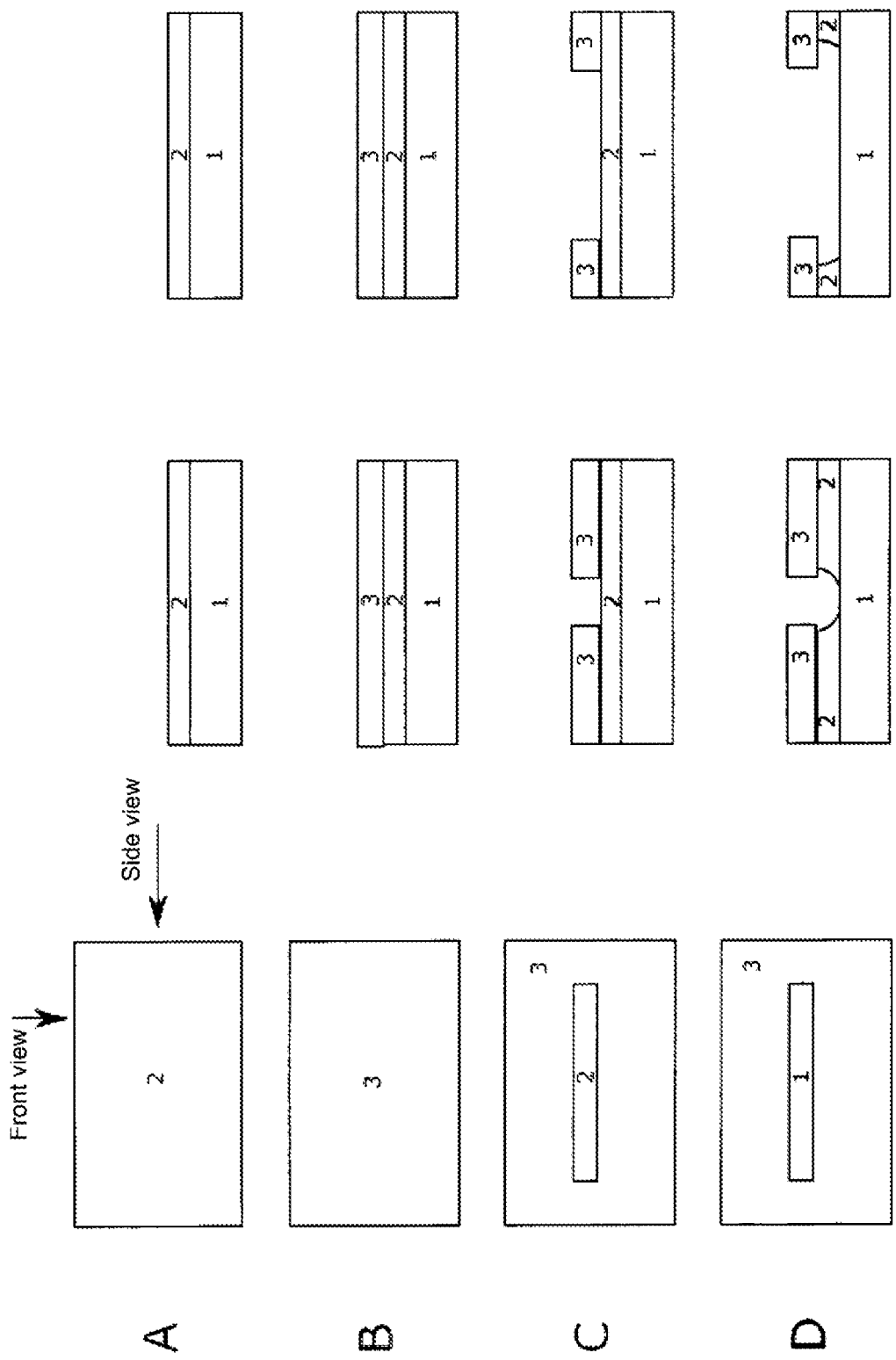
FIG. 1 illustrates a process for preparing a substrate for a structured deposition of a Majorana material by producing a first functional mask on the substrate according to an embodiment of the invention.
Figure 2:
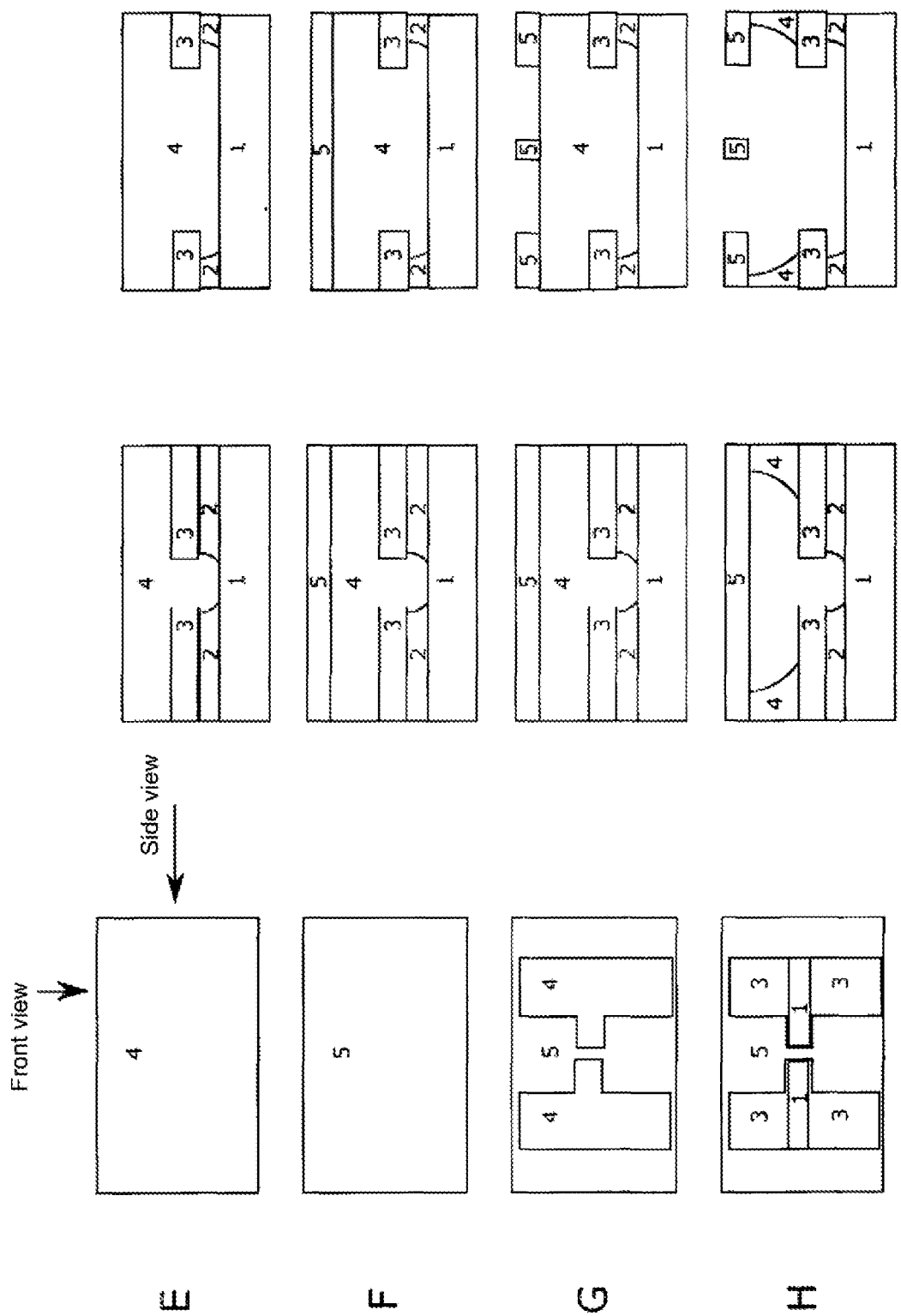
FIG. 2 illustrates a process for producing a shadow mask close to a surface for a defined application of at least one superconductive material to a substrate according to an embodiment of the invention.
Figure 3:
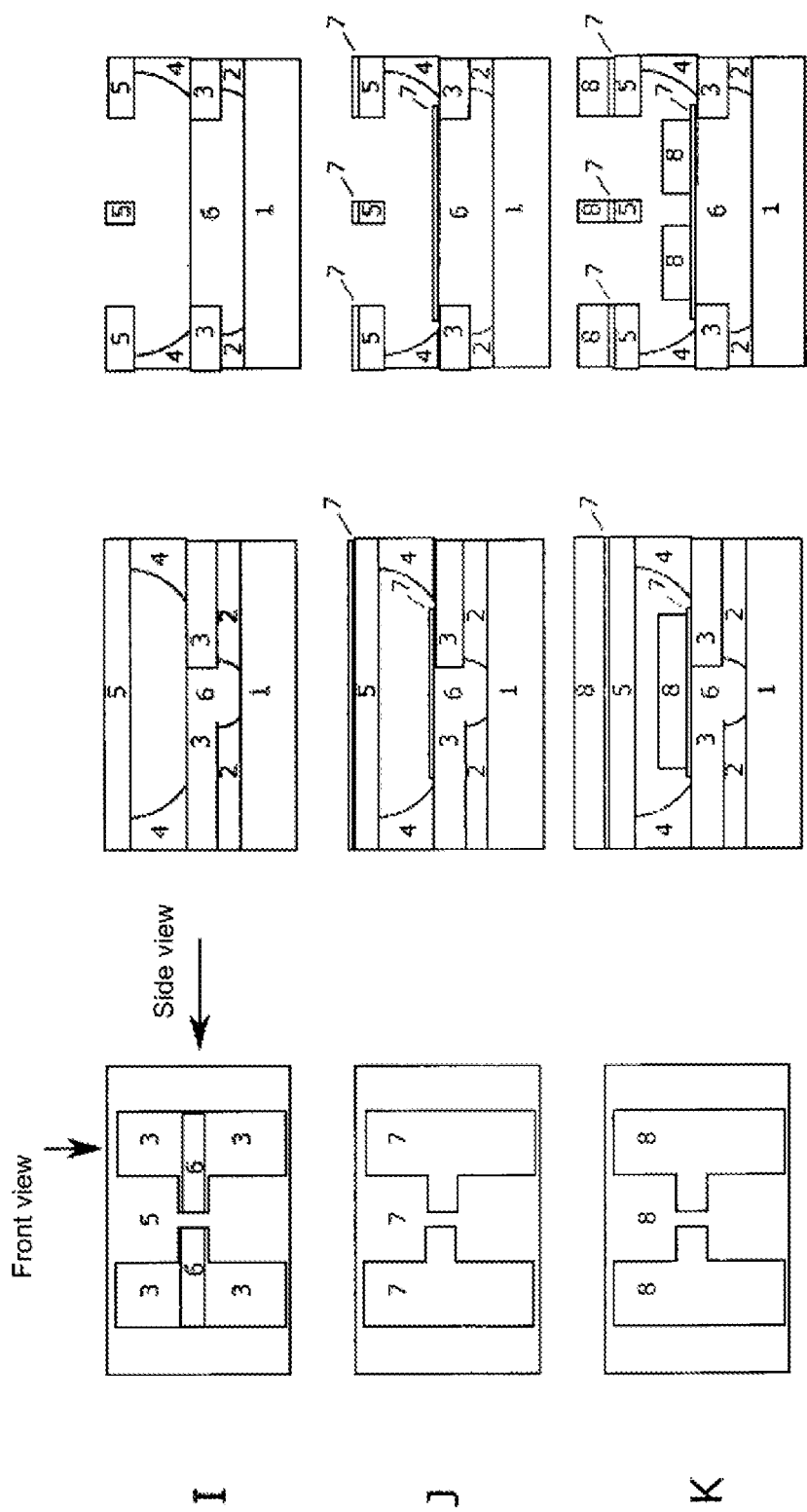
FIG. 3 illustrates a process for directed and structured application of functional layers according to an embodiment of the invention.
Figure 4:
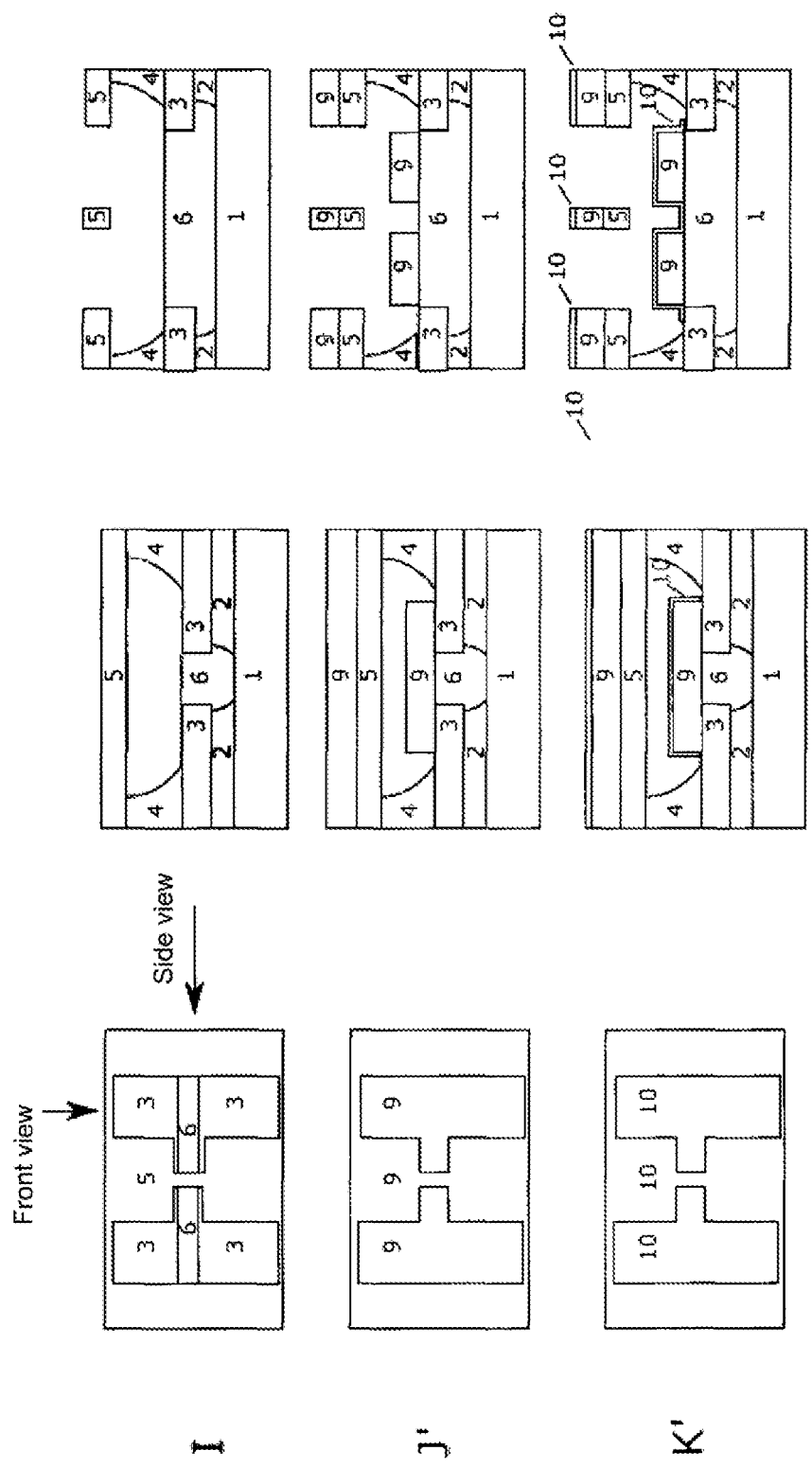
FIG. 4 illustrates a process for directed and structured application of functional layers according to an embodiment of the invention.

Embodiments of the invention provide methods by way of which Majorana-material superconductor structures, also referred to below as hybrid structures, comprising at least one structured Majorana material and at least one superconductive material arranged thereon in a structured manner, can in a few process steps be generated as the smallest unit of a Majorana-material superconductor hybrid network. On the one hand, the methods provide a high quality of the surfaces and interfaces and additionally provide passivation of the structured Majorana material. In particular, the methods enable preservation of the generated surface states, in particular for Majorana physics.

Furthermore, the method should make it possible for the structured Majorana material and the superconductive material to be aligned relatively to one another with high accuracy, and for a high scalability to be ensured.

Furthermore, embodiments of the invention provide high-quality hybrid structures, with which networks of any complexity can be constructed from Majorana-material superconductors, by means of the aforementioned methods.

According to the invention, methods are provided for producing a Majorana-material superconductor structure, hereinafter called a hybrid structure for short, comprising at least one structured Majorana material, at least one structured superconductive material arranged thereon, and a passivation layer arranged on the free surface(s) of the structured Majorana material.

According to embodiments of the invention, hybrid structures comprising at least one structured Majorana material, in particular comprising at least one structured Majorana material in the form of a laterally grown (quasi-) 1D nanowire or a laterally grown (quasi-) 1D nanostructure, at least one structured superconductive material arranged thereon, and a passivation layer arranged on the free surface of the structured Majorana material, are provided.

The invention provides methods in which a Majorana-material superconductor structure—a hybrid structure for short—can be produced with the aid of a mask close to the surface. This hybrid structure comprises at least one structured Majorana material which is defined within the scope of this invention as a laterally grown (quasi-) 1D nanowire or a laterally grown (quasi-) 1D nanostructure, wherein the latter, for example, can take the form of a structured topological thin film. In addition to the structured Majorana material, the hybrid structure has at least one structured superconductive material arranged on this structured Majorana material and a passivation layer arranged on the free surfaces of the structured Majorana material, said material not being contacted by the superconductive material.

In the structures according to the invention, a particular quality of the interface between, for example, a topological insulator and a superconductive metal is ensured by in-situ and preferably by epitaxial growth of both layers.

Furthermore, with the methods according to the invention, a protective passivation layer can also be produced directly during production over exposed regions of the structured Majorana material, which advantageously leads to the surface states thereof being neither destroyed nor changed. Surface states in topological insulators are also called Dirac states.

In the methods according to the invention, in addition to a mask known from the prior art for structured application of at least one superconductive material on a Majorana material (shadow mask, hard mask, stencil mask), a further mask which serves for depositing the Majorana material on a substrate in a defined geometry is advantageously previously produced directly on the substrate (mask for producing a preliminary structure, "selective area"). The formation of two masks on the substrate in the production of the hybrid structure subsequently advantageously leads to both the deposited structured Majorana material and the subsequently at least one superconductive structure being able to preferably be precisely aligned relatively to each other even during their production. Since the process steps are carried out throughout in an inert atmosphere and preferably in the ultrahigh vacuum, a very high quality of the interfaces of the hybrid structure can additionally be ensured according to the invention.

By the methods according to the invention, laterally grown heterostructures of superconductive materials and Majorana materials can advantageously be produced with high quality and precise alignment. Various geometries and dimensions allow the structured definition of functional devices, starting with topological Josephson junctions up to complex networks for applications in scalable topological qubits as well as topological quantum registers.

According to the invention, both the structured Majorana material and the superconductive material can be laterally grown. In the methods according to the invention, both the structured Majorana material and the superconductive material are structured and applied relatively to each other without the need to carry out this processing after the deposition. In comparison to previously known methods of in-situ structuring, the methods according to the invention offer particular advantages in the abruptness of the interfaces and the possible dimensioning of the individual functional layers.

Such high-quality hybrid structures produced according to the invention can preferably be used in topological Josephson contacts but also in complex components, such as topological SQUIDs (abbreviation for superconductive quantum interference devices), topological qubits (abbreviation for quantum bits) and topological quantum registers, which serve as the smallest unit for the well-defined junction of a topological material and a superconductor.

For the mentioned applications of such hybrid structures in Majorana physics and the topological quantum computing based thereon, it is necessary for the components or interfaces to be produced to be of high quality, as they provide the structures according to the invention.

A Josephson contact, which, for example, comprises such structures according to the invention, refers to two superconductive materials which are separated from each other by a thin, non-superconductive region. In the following, the term "weak link" refers to the region which separates the two superconductors from each other in the Josephson contact and which is not superconductive by definition.

The invention is described in more detail below with reference to an example of a topological Josephson contact as an example of a hybrid structure according to the invention, without being limited thereto. The topological Josephson contact comprises two superconductive materials arranged laterally to one another and a structured Majorana material characterizing the non-superconductive region (weak link).

It is known from the prior art that a weak link as an intermediate region between two superconductors comprising a topological material can likewise be superconductive if the distance between the superconductors is sufficiently short. Such a distance is sufficiently short if it is less than the coherence length of the paired electron states in the topological material. In the case of aluminum as superconductive material, the coherence length is known to be 100-400 nm, depending on the quality of the crystalline material and the boundary layer between superconductor and topological material. When using niobium, this characteristic value of the coherence length is somewhat reduced due to the higher transition temperature and lies in a range between 50-250 nm.

In the case of a Josephson contact, quality assurance means that on the one hand a good transportation is ensured in the region of the weak link, for which purpose an in-situ covering (capping) is necessary, and that on the other hand the contact has a clean and sharp interface between the superconductors and the structured Majorana material. This can be achieved in particular by in-situ and preferably by epitaxial growth of both layers. Both the structured and relatively aligned growth of the structured Majorana material, the in-situ capping, and the in-situ application of the preferably epitaxial, superconductive contacts are made possible by the method according to the invention without departing from an inert atmosphere and/or ultrahigh vacuum in the process.

In order to produce such a hybrid structure, the invention provides for using, in addition to an already known stencil mask (shadow mask), a further mask by means of which the geometry of the structured Majorana material can be defined and which is likewise firmly connected to the substrate.

A method according to the invention for producing hybrid structures is specified below with reference to an example of a Josephson contact using a topological insulator and superconductive metals, without being limited to this specific embodiment.

The individual steps of a method according to the invention can be followed on the basis of FIGS. 1 to 6 with reference to the example of the production of a Josephson junction (Josephson contact) as a hybrid structure according to the invention. The materials or layer details mentioned by way of example in the process steps below are expressly not to be understood as limiting. A person skilled in the art can easily see which details relate specifically to the Josephson junction and would have to be modified accordingly in the production of other hybrid structures.

The production of a Josephson contact described here by way of example is not to be understood as limiting but at the same time serves as the smallest unit of a topological qubit as an illustration of the exemplary embodiments listed thereafter. The letters given to the process steps for producing an individual topological Josephson contact correspond to those in FIGS. 1 to 6. Further exemplary embodiments for producing more complex devices based on such individual Josephson contacts can be seen in FIGS. 7 to 8.

A method according to the invention can be divided into three subprocesses in all.

Subprocess I: Preparing the substrate for a structured deposition of the Majorana material (process step (I) "Selective area") by producing a first functional mask on the substrate.

Subprocess II: Producing a shadow mask (stencil mask) close to the surface for the defined application of at least one superconductive material (process step (II) "Stencil mask") to the substrate as well.

Subprocess III: A method during deposition within a vacuum chamber for the directed and structured application of the functional layers (process step (III) "Coating method").

In order to distinguish between various possibilities of depositing functional structures in a structured manner with the aid of the generated mask, the third subprocess also comprises two different variations.

Subprocess I: "Selective Area"

I.A A first additional layer (2) is applied areally and under vacuum, preferably in the ultrahigh vacuum, to a cleaned substrate (1). The substrate may be, for example, a silicon wafer of any type or a silicon wafer portion. A cleaned substrate is understood to be one which has been treated with a standard substrate-typical method known to the person skilled in the art for removing contaminations on the substrate surface. In this way, a substrate surface is provided which has only substrate-inherent connections.

The material of the substrate must be suitable for the growth of a topological insulator thereon. A material which can be selectively etched with respect to the substrate and the second layer (3) can preferably be used for the first layer (2). Suitable for this purpose is, for example, silicon dioxide ($SiO_2$), wherein the latter should preferably be of high quality and able to be produced by way of example in a method for thermal conversion of the silicon surface. Advantageously, this $SiO_2$ has very good etching selectivity in comparison to the silicon of the substrate (1) and of the second additional layer (3).

The $SiO_2$ layer can, for example, be removed isotropically by hydrofluoric acid, wherein an atomically flat surface suitable for growth is produced on the substrate. Advantageously, the $SiO_2$ layer also has dielectric properties, whereby leakage currents can be suppressed. From the prior art is known that when stoichiometric silicon nitride ($Si_3N_4$) is used as second additional layer (3), a thin $SiO_2$ layer 1 to 10 nm thick effectively reduces or prevents tensions which the $Si_3N_4$ can exert on the silicon surface. Tensions in the silicon substrate can have a negative effect on the covering of the substrate by the first functional layer (6).

The selected layer thickness of the first layer (2) should compensate possible tensions on the substrate. A possible range of 1 to 20 nm, preferably a range of 1 to 5 nm, is selected as the layer thickness for the first layer (2).

I.B A second additional layer (3) is applied areally and under vacuum to the first additional layer (2). Said layer (3) is characterized in that it can be removed selectively with respect to the first additional layer (2). In the exemplary embodiment given, the second layer should be HF-resistant and in particular low-tension. In the foregoing example, stoichiometric silicon nitride ($Si_3N_4$) having a low density of parasitic hydrogen compounds is used by way of example. A suitable method in this case is the deposition of the nitride from the gas phase under low pressure (low-pressure chemical vapor deposition, LP-CVD). A transparent $Si_3N_4$ layer can advantageously be used as a mask in wet-chemical or dry etching methods. The second additional layer (3) is used to define subregions on which the topological insulator is not deposited selectively with respect to the silicon substrate during growth.

The surface of the second layer (3) advantageously ends at the surface of the first functional layer (6) in process step III.I. The layer thickness should therefore be selected in the range of 0.2 to 250 nm, preferably in the range of 5 to 100 nm.

I.C After application of the second additional layer (3), this layer is structured, advantageously via electron beam lithography (EBL) using a suitable lacquer or resist. After the development of the lacquer, the structures defined in the resist are transferred into the second additional layer (3) by means of a suitable etching method. The second additional layer (3) is in this respect partly removed in a selective and structured manner with respect to the first additional layer (2).

The desired structures in the second additional layer (3) can advantageously be precisely produced by reactive ion etching (RIE), in particular in an $Si_3N_4$ layer. In particular, anisotropic structures are produced by this directed etching method.

Suitable in the example presented here is reactive ion etching using, by way of example, fluoroform and pure oxygen as reactive gas constituents. Alternatives would be, for example, the wet-chemical removal of the silicon nitride by phosphoric acid or physical removal of the silicon nitride with the aid of accelerated ions, e.g. in an ion beam system (ion beam etching, IBE).

In the method presented here for structuring the second layer (3), thin trenches having a width of 10-10 000 nm, preferably of 30-200 nm, are, for example, defined in the second layer (3). The length of the trenches produced preferably varies between 100 nm and 100 µm, preferably between 3 and 10 µm. The trenches may also be defined in ring or rectangular structures.

Via method steps A to C, a first functional mask is thus formed, with the aid of which, according to the invention and advantageously, a defined geometry of the structured Majorana material is made possible.

I.D The exposed subregions of the first additional layer (2) are selectively removed with respect to the second additional layer (3) and the substrate (1). A process which does not chemically convert the substrate (1) and/or damage the substrate surface is preferably used here. By way of example, dilute hydrofluoric acid, which selectively etches the silicon dioxide and uncovers the surface of the silicon substrate unchanged, is used.

The isotropic etching behavior of the silicon dioxide in the dilute hydrofluoric acid forms an etching profile close to that shown in FIG. 1, process step D.

Subprocess II: "Stencil Mask"

II.E In a first step, a third additional layer (4) is deposited areally and under vacuum on the structures produced in subprocess I. Said layer should be selectively removable with respect to the substrate (1) and the first (2) and second (3) additional layers. By way of example, silicon dioxide with reduced quality with respect to the first silicon dioxide layer (2) is used here, as soon as it can be deposited from the gas phase at low pressure (low-pressure chemical vapor deposition, LP-CVD). This second layer of silicon dioxide (4) is etched significantly faster in dilute hydrofluoric acid so that this layer can be removed selectively with respect to the first silicon dioxide layer (2) through the selection of the etching time.

The selected layer thickness of the third additional layer (4) defines the distance of the mask (shadow mask) that is close to the surface from the substrate surface (1). Up to four functional layers are deposited on the substrate surface in subprocess III. A range of 5 to 500 nm, preferably a range of 10 to 150 nm, is therefore selected as the layer thickness for the third additional layer (4).

II.F A fourth additional layer (5) is applied areally and under vacuum to the third additional layer (4). Said fourth additional layer should be selectively removable with respect to the third additional layer (4). When using silicon nitride again, the methods mentioned in process step I.C can be used.

II.G The fourth additional layer (5) is partially removed selectively with respect to the third additional layer (4). The structures to be produced vary depending on the desired device. Various embodiments of the structures are described by way of example in the section with the exemplary embodiments. The structures here include both large areas and small, narrow junctions, both of which are aligned relatively to the produced structures in the first additional layer (2). Said junctions, which ultimately define Josephson contacts, have at least the width of the structures in the first additional layer (2) previously produced in process step I.C and a lateral distance from one another of 10-500 nm, preferably 10-200 nm. This narrow region is referred to hereinafter as the nanobridge.

II.H The third additional layer (4) is at least partially removed selectively with respect to the substrate (1) as well as the first (2), second (3) and fourth additional layers (5). In the process, the regions exposed in step II.G are removed. It is necessary for a method according to the invention that the third additional layer (4) be removed isotropically in all directions. As a result, any material of the third additional layer (4) beneath the nanobridges defined in step II.G is removed. In addition, the structures defined in submethod I are partially exposed. The nanobridges are partially freely suspended above the substrate (1) from this point in time on.

In this respect, a second functional mask, which is frequently also called a shadow mask, is formed via method steps D to F.

In this respect, the two subprocesses I and II serve for preparing the actual deposition or generation of the functional layers of the hybrid structures on the substrate.

The subsequent process steps I to K are carried out successively in an inert atmosphere without interrupting the vacuum, and in particular the ultrahigh vacuum ($p \leq 1 \times 10^{-7}$ mbar, preferably $p \leq 1 \times 10^{-8}$ mbar). Pure $N_2$ gas is regarded as an inert atmosphere, for example.

Subprocess III: "Coating Method" Variant A

III.I The sample with the nanobridges and the partially exposed areas of the substrate (1) is transferred into a vacuum chamber, for example into that of a molecular beam epitaxy system, for the deposition of the functional layers/structures. However, this method step can also take place in other coating installations in which the growth is carried out in a partially directed manner. The growth of III/V nanowires in a chemical vapor deposition (CVD) system can be mentioned here by way of example. The first functional layer (6) is deposited. This layer must grow selectively on the exposed substrate surface (1), while it is necessary that no material be deposited on the exposed surfaces of the additional layers (2, 3) and advantageous that no material be deposited on the surfaces of the additional layers (4, 5). The first functional layer (6) comprises Majorana materials.

Topological insulators of the form $(Bi_xSb_{1-x})_2(Te_ySe_{1-y})_3$, where $0 \leq x \leq 1$ and $0 \leq y \leq 1$, for example, grow on a silicon (111) surface selectively with respect to silicon dioxide (2, 4) and silicon nitride (3, 5) surfaces.

This deposition is carried out with a substrate rotation of 1-500 $min^{-1}$, which guarantees that the topological insulator also grows on the exposed subregions beneath the nanobridges.

The first functional mask produced by method steps A to C defines the structure of the Majorana material.

The layer thickness is adjusted in particular in such a way that the surface of the topological thin film (6) preferably ends at the exposed surface of the second layer (3).

III.J A second functional layer (7) which is capable of forming a native oxidation layer, for example aluminum or niobium or tungsten, titanium, hafnium or platinum, is also applied in a surface-covering manner with substrate rotation. Preferably, a superconductive metal is used, for example, aluminum or niobium. Due to the substrate rotation, this layer is also deposited beneath the nanobridges.

In the embodiment described here, the layer thickness of the second functional layer (7) must not exceed the thickness of the native oxide of the respectively selected material in order to be able to form a passivation layer for the topological insulator in subsequent steps.

In one embodiment of the method, a thin film comprising aluminum is applied, since a passivation layer can advantageously be specifically formed in aluminum. For example, the thin film comprising aluminum can be applied with a layer thickness of at most 3 nm, because this layer thickness ensures that the aluminum layer as the second functional layer (7) completely oxidizes in a subsequent oxidation as soon as it comes into contact with air.

III.K A third functional layer (8) comprising a superconductive material, for example aluminum or niobium, is applied without substrate rotation in a structured manner to subregions of the second functional layer (7). The nanobridges defined in the fourth additional layer (5) partially shadow the atomic/molecular flow. Due to this partial shadowing of the atomic/molecular flow, the second functional layer (7) is not coated completely areally but only in subregions.

The layer thickness of the now deposited material (8) should on the one hand be at least the critical thickness for obtaining the superconductive properties of the material but should on the other hand not fall below the thickness of a native oxide formed in a subsequent step of the material used.

In addition, the layer thickness of the third functional layer (8) should not exceed the distance between the surface of the second functional layer (7) and the lower edge of the fourth additional layer (5), since otherwise an undesired contact of the generated hybrid structure and the shadow mask cannot be ruled out.

The layer thickness of the deposited subregions (8) regularly amounts to 5-500 nm, depending on the chosen layer thickness of the first additional layer (2). The layer thickness should preferably be selected between 30 and 100 nm in order to ensure the superconductive properties of most superconductive metals, wherein the subsequent formation of the oxide layer should also be taken into account.

The material of the second functional layer (7) can be selected identically to the material of the third functional layer (8), i.e. a superconductive material. However, the two materials can also be selected differently, since superconduction is not absolutely necessary for the function of the second functional layer, but the formation of a native oxide layer as passivation layer is paramount. When selecting a non-superconductive material as an interdiffusion barrier, it should be taken into account that this barrier is chosen to be thin enough for the proximity-induced superconduction to be ensured via the defined weak link.

In a method according to the invention, it is therefore, for example, advantageous to select titanium as the second functional layer (7) since it can serve as an interdiffusion barrier between the first functional layer (6) and the third functional layer (8), but to select another superconductive metal, for example aluminum or niobium, as the third functional layer (8) since these metals have particularly advantageous superconductive properties with respect to titanium.

Submethod III: "Coating Method" Variant B

III.I This method step corresponds to that of variant A.

III.J' A second functional layer (9) comprising superconductive material, for example aluminum or niobium, is applied without substrate rotation to subregions of the first functional layer (structured Majorana material) (6). The nanobridges defined in the fourth additional layer (5) partially shadow the atomic/molecular flow. Similarly to III.K, due to this partial shadowing of the atomic/molecular flow, the structured Majorana material (6) is coated with the superconductive material of the second functional layer (9) only in subregions in a not completely areal but structured manner.

In an alternative embodiment, the second functional layer (9) can also be applied as a layer system consisting of a thin interdiffusion barrier and a thick superconductive layer. A metal or a superconductor can preferably be selected as the material for the interdiffusion barrier. For the layer thickness of the superconductive layer, the critical thickness for obtaining the superconductivity must again be taken into account. Thin layers of platinum, tungsten or titanium are, for example, known as an interdiffusion barrier from the literature. When selecting a non-superconductive material as an interdiffusion barrier, it should be taken into account that this barrier is chosen to be thin enough for proximity-induced superconduction to be ensured via the defined weak link.

The thickness of the deposited material for the second functional layer (9) should be at least the critical thickness for obtaining the superconductive properties of the material, wherein the layer thickness of the native oxide must additionally be taken into account. This forms when after deposition the material used comes into contact with atmospheric oxygen or oxygen in any other form.

The thickness of the subregions of the second functional layer (9) is therefore advantageously between 50 and 100 nm, wherein the thickness of the material should not exceed the distance between the surface of the first functional layer (6) and the fourth additional layer (5).

III.K' A third functional layer (10) comprising an electrically insulating material is applied in a surface-covering manner to the second functional layer (9)/the layer system, as well as to the exposed regions of the first functional layer (6). This definition includes oxidizing metals as mentioned in process step III.J.

In this embodiment of submethod III, however, other materials can advantageously also be used to protect the surface and the surface states of the structured Majorana material in the subregions produced in process step III.J'. The materials used should have a sufficiently high band gap such that no cohesive tunneling of charge carriers in the selected material can occur in the technically relevant temperature range, taking into account the actual electron temperature. The technically relevant range is defined by the characteristic critical temperature of the superconductor used.

This third functional layer (10) preferably reacts/interdiffuses neither with the first functional layer (6) nor with the second functional layer (9). Silicon nitride may be used as the third functional layer (10), for example.

Furthermore, inert metal oxide compounds, such as $Al_xO_y$, $Nb_xO_y$, $Ti_xO_y$, where $0 \leq x$, $y \leq 1$, or even inert metal compounds with other group VI elements, such as sulfur, tellurium or selenium, are also suitable. Layers of pure tellurium or selenium can likewise be deposited as temporary protection of the topological surface states.

By methods according to the invention, laterally grown heterostructures of structured superconductive materials and structured Majorana material can advantageously be produced with high quality and precise alignment. This is important, for example, for the characterization of the superconductive properties of topological materials but ultimately also for applications in scalable topological qubits as well as quantum registers.

All ex-situ steps used in the prior art can advantageously be bypassed in a clean room by the methods according to the invention and complex devices can be produced or grown in situ. Prior to growth, preparations of the substrates known to the person skilled in the art in this field can grow devices having contact pads, sawing markers, lateral superconductive structures, and structured topological thin films. All prior-art problems in the production, in particular of topological Josephson contacts, in the clean room are thus circumvented. This is particularly advantageous in the case of topological materials, since the surface and thus the topological properties can be altered or even destroyed by an exchange with the environment, for example, with atmospheric oxygen.

In particular, the methods according to the invention are advantageously associated with high scalability at low cost and with little time expenditure. In contrast to conventional methods for producing nanowire qubits from the prior art, not every nanowire or nanostructure needs to be positioned and contacted manually in the methods according to the invention, but structured Majorana material can be deposited on a suitably prepared substrate and defined in a targeted and selective manner. With regard to scalability, the methods according to the invention offer advantages as soon as the size and complexity of the desired devices, such as qubits or quantum registers, increases.

As suitable methods for applying layers for the methods according to the invention are to be mentioned in this case chemical vapor deposition at low pressure (liquid-phase chemical vapor deposition, LP-CVD) and molecular beam epitaxy (MBE) in addition to physical vapor deposition (PVD).

Chemical vapor deposition is particularly suitable for the generation of flat silicon-containing layers for the deposition of the first and second as well as the third and fourth additional layers in accordance with method steps I.A, I.B, II.E and II.F.

Molecular beam epitaxy is particularly suitable for applying the functional layers in accordance with method steps I to K.

Epitaxial growth is understood in particular to mean that a further crystalline layer is deposited on a crystalline layer or on a crystalline substrate, wherein at least one crystallographic orientation of the growing crystal layer corresponds to an orientation of the crystalline layer or of the crystalline substrate.

In addition to the in-situ production of the preferably epitaxial contacts, the formation of a protective passivation layer, which protects the topological insulator (structured Majorana material) from contamination or chemical restructuring of the surface, is realized in situ. The topological material is effectively protected from any exchange with atmospheric oxygen or other constituents of the natural environment.

As a passivation layer, an aluminum layer 2 nm, maximally 3 nm thick can, for example, be grown on the topological insulator, which aluminum layer oxidizes completely after outward transfer of the sample from the inert atmosphere and, where applicable, from the ultrahigh vacuum, and thus protects the surface states of the structured Majorana material thereunder. Furthermore, already inert metal oxide compounds, such as $Al_xO_y$, $Nb_xO_y$, $Ti_xO_y$, where $0 \le x, y \le 1$, are also suitable and inert metal compounds with other group VI elements, such as sulfur, tellurium or selenium, can also be used. Layers of pure tellurium or selenium have also proved themselves as a temporary protection of the topological surface states.

A method according to the invention, illustrated here by way of example with reference to the production of a Josephson contact using topologically induced superconductivity, advantageously enables an in particular epitaxial production of the in-situ contacts, which leads to a particularly high quality of the interface. In the realization of superconductor/normal conductor interfaces, the quality of the interface is indicated by the transparency. Transparency is generally understood to mean the probability of the successful exchange of paired electron states via the interface, also known as Andreev reflection. The Andreev reflection process at the interface is opposite to the direct backscattering of the individual electrons at the interface. The probabilities of the Andreev reflection and of the normal reflection add up to 100%.

Within the framework of this invention, a method is presented for producing a topological Josephson contact, as an example of a hybrid structure according to the invention, while maintaining the surface properties of the topological material for current transport between the structured superconductive contacts, in which method the interfaces between the superconductors and the structured Majorana material as a topological insulator also have a particular quality and are formed so accurately and cleanly that Majorana physics is advantageously also practicable therewith. In particular, with such a hybrid structure, a topological qubit, in which, in contrast to conventional qubits, theoretically no error correction is required, can be produced.

The production of hybrid structures according to the invention, including the structured definition of the deposited Majorana material, of the structured superconductive contacts grown in situ and preferably epitaxially, and of the passivation layer can advantageously be carried out without interrupting the inert atmosphere, in particular in the ultrahigh vacuum, within a clean room system, for example, with the aid of a molecular beam epitaxy system.

The topological material, the in-situ and preferably epitaxially grown superconductive contacts and the passivation layer can be deposited in a method according to the invention in a very defined manner in a large region of lateral dimensions of 5 nm to 10 000 μm.

In addition, in methods according to the invention, the structures are aligned relatively to one another with deviations in the range of 2.5 nm to at most 20 nm given by the structure definition with electron beam lithography. With this method, preferably any 2D layouts of insulating, passivating and (super)conductive regions can be defined in situ.

In order to produce the structured Majorana material, the invention in particular provides the use of a further mask (2, 3), via which the geometry of, for example, a topological thin film can be defined, in addition to a shadow mask.

For this purpose, the property of the topological materials of growing selectively is advantageously used. By way of example, when using silicon substrates, an additional layer can be applied to the substrate, on which layer the topological material does not grow at all or only grows when different growth parameters are selected. If the substrate is exposed in places, the topological material will deposit only in these defined regions. Depending on the selection of the growth parameters, the Majorana material will then grow selectively in the exposed subregions of the silicon substrate with respect to the additional layer.

Molecular beam epitaxy is advantageously suitable for applying the structured superconductive layers as well as the structured Majorana material, since the directed atomic/molecular flow of the materials during evaporation from the solid phase can advantageously be partially shadowed in methods according to the invention using the defined mask or using the defined nanobridges.

In the coating method, different shadowings can advantageously be implemented by varying the angle of incidence and omitting the substrate rotation, even when a rigid mask is used. As a result, different regions beneath the mask can be grown or structured.

The methods according to the invention make it possible to grow or vapor-coat or cover an air-sensitive and/or environment-sensitive functional layer, for example, the surface of a topological insulator, in situ and selectively. At selected locations, a thick superconductive layer is applied to the topological insulator, while at other selected locations only a thin layer is arranged, which after exposure to air can react with the environment to form an insulating protective layer for the topological insulator for example, when oxidizing materials are used. This advantageously ensures local contacting of the functional layer and at the same time guarantees a passivation layer protecting the entire component.

In this application, a rotation of the substrate in the methods according to the invention is understood to be a relative movement between the produced layer structure, including the substrate, and the mask and the source of the coating, e.g. the molecular beam, such that, despite the shadowing effect of the mask and in particular of the nanobridges, all regions on the exposed substrate surface are covered by the molecular beam. For this purpose, the molecular beam must, for example, on the one hand impact the substrate or the mask at a certain angle not equal to 90°, and/or the substrate must on the other hand be rotated under the molecular beam in the substrate plane during the coating. Substrate rotations of 1-500 min$^{-1}$ are typical.

The functional layers can be applied without interrupting the inert atmosphere and preferably in the ultrahigh vacuum in, for example, the molecular beam epitaxy system. After outward transfer of the substrate with the defined structures from the inert atmosphere, oxidation of the regions of the superconductive material close to the surface takes place in the presence of atmospheric oxygen. In a first embodiment of the invention (variant A), the formation of a passivating oxide layer takes place for subregions having a layer thickness below the layer thickness of the native oxide of the material in question. The formation of this passivation layer on the surface of the topological insulator between the two superconductive contacts causes the surface and the current-carrying surface states of the topological material to be protected.

The analysis of the local arrangement of individual atoms (by means of atomic-probe tomography and transmission electron microscopy) of any hybrid system makes it possible to differentiate the method described here from other methods, in particular to distinguish whether the individual layers were applied in vacuo or in an inert atmosphere, and no oxygen traces can therefore be detected at the interfaces.

For subregions having a correspondingly thicker layer thickness, an oxidation layer, corresponding to the native oxide thickness, likewise forms in a region close to the surface. However, in these subregions having a layer thickness above the native oxide thickness and above the critical thickness for obtaining the superconductive properties, the material still has superconductive properties despite the oxidation of the uppermost layer at the interface with the topological material.

In a further embodiment of the method according to the invention, oxidizing materials are not exclusively used for forming the passivating layer. In this further embodiment (variant B), the superconductive contacts are still defined by targeted shadowing of the atomic/molecular flow. After applying the superconductive contacts in a structured manner and ensuring the quality of the junction between the superconductive material and the underlying structured Majorana material, a passivating layer can be deposited in a surface-covering manner over remaining, exposed subregions of the structured Majorana material. The materials mentioned above can be used as a passivating layer, for example.

By the methods according to the invention, laterally grown heterostructures of superconductive materials and Majorana materials of high quality and precise alignment can be produced. Various geometries and dimensions allow the structured definition of functional devices, such as topological Josephson junctions, up to complex networks for applications in scalable topological qubits as well as topological quantum registers.

The subject matter of the invention is explained in more detail below with reference to two exemplary embodiments and a number of figures. These examples are not to be understood as limiting.

In the exemplary embodiments, preferred embodiments of the methods according to the invention for producing a Josephson contact using a structured Majorana material and a superconductive metal are mentioned first. The definition of the Josephson contact is not to be understood as limiting but as the smallest unit of a topological qubit at the same time serves as an illustration of the exemplary embodiments realized thereafter. The letters of the process steps for producing an individual topological Josephson contact correspond to those in FIGS. 1 to 6.

The method according to the invention comprises a plurality of functional layers, wherein specific materials, which are not to be understood as limiting, are mentioned for use in the following exemplary embodiments. The method is divided into a total of three submethods: preparing the substrate for a structured deposition of the Majorana material (process step (I) "Selective area"), applying a stencil mask or shadow mask close to the surface for defined application of the superconductive metal (process step (II) "Stencil mask") and the method during deposition within a molecular beam epitaxy system for directed application of the functional layers (process step (III) "Coating method").

Submethod I: "Selective Area"

I.A The first 5 nm of a 525 μm thick, boron-doped (>2000 Ωcm), 4" silicon wafer (1) with an orientation of the surface normal in the <111> direction are nominally converted under vacuum into silicon dioxide ($SiO_2$) (2), starting from the surface of the substrate. For this purpose, a Tempress TS 8 horizontal furnace is used for the formation of dry oxide. After oxidation at 820° C. with the aid of molecular oxygen, an actual layer thickness of 5.8 nm is achieved. The silicon dioxide converted in this way has an etching rate in dilute hydrofluoric acid (1% HF) of 6 nm/min.

I.B A layer of stoichiometric silicon nitride ($Si_3N_4$) (3) nominally 20 nm thick is applied areally and under vacuum to the converted silicon dioxide layer (2). The silicon nitride is deposited in a Centrotherm LPCVD system E1200 R&D furnace at 770° C. with the aid of 120 sccm ammonia ($NH_3$) and 20 sccm dichlorosilane (DCS). An actual layer thickness of 25.6 nm is achieved. The resulting silicon nitride is etched at a rate of 0.4 nm/min in dilute hydrofluoric acid (1% HF).

I.C After application of the stoichiometric silicon nitride (3), said layer is structured. To this end, 120 nm AR-P 6200 resist is first applied, which is structured in a Vistec EBPG 5000+ electron beam lithography system. The electrons experience a 50 kV accelerating voltage with a 100 μA strong beam current. A step size of 5 nm and a proximity-corrected dose of 250 μC/cm$^2$ were chosen. The resist is subsequently developed at 0° C. for 60 seconds in AR 600-546. Development is brought to a stop in a 60-second 2-propanol bath. After development of the resist, the structures defined in the resist are transferred into the stoichiometric silicon nitride (3) by means of an Oxford Plasmalab 100 system. The plasma used is ignited from fluoroform ($CHF_3$) and molecular oxygen ($O_2$) in a ratio of 22 sccm $CHF_3$ to 2 sccm $O_2$ at a selected power of 50 W RF power. The etching time is 90 seconds.

In the exemplary method for structuring the stoichiometric silicon nitride (3), thin trenches having a width of 40-10 000 nm are defined. The length of the trenches produced varies from 3 μm to 100 μm.

I.D The exposed subregions of the first silicon dioxide layer (2) are etched isotropically in dilute hydrofluoric acid (1% HF) for 75 seconds. The etching process is stopped in deionized water. The isotropic etching behavior of the silicon dioxide in the dilute hydrofluoric acid forms an etching profile close to that shown in FIG. 1, process step D.

Submethod II: "Stencil Mask"

II.E In a first step, a layer of silicon dioxide nominally 400 nm thick (4) is deposited areally and under vacuum on the structures produced in submethod I. This layer is deposited in a Centrotherm LPCVD system E1200 R&D furnace at 650° C. and with the aid of tetraethoxysilane.

Said silicon dioxide layer (4) forms the lower silicon dioxide (2) and silicon nitride layers (3) and fills them. The upper silicon dioxide layer (4) is chemical-mechanically polished (chemical-mechanical planarization, CMP) and thus smoothed.

II.F To the second silicon dioxide layer (4), a further layer of stoichiometric silicon nitride (5) is applied areally and under vacuum. The LP-CVD process as mentioned in process step I.C is again carried out. A layer of stoichiometric silicon nitride nominally 100 nm thick is applied.

II.G The second layer of stoichiometric silicon nitride (5) is partially removed selectively with respect to the second layer of silicon dioxide (4). The electron beam lithography process as mentioned in sub-process I.C is again carried out. Junctions are defined which ultimately represent the weak link of a simple Josephson contact. This narrow region was already referred to as a nanobridge in the preceding continuous text. The junctions therefore have at least the width of the structures previously produced in process step I.C in the first layer of stoichiometric silicon nitride (3) and a lateral distance from each other of 20-200 nm. The alignment of the nanobridges relative to the trenches is carried out via corresponding markers.

III.H The second layer of silicon dioxide (4) is removed selectively with respect to both the silicon substrate (1) and the first layer of silicon dioxide (2) as well as the first (3) and second layers of stoichiometric silicon nitride (5). In the process, the regions exposed in step II.G are removed. Viewed relatively, the etching selectivity results from the different etching rates of the layers mentioned. It is necessary for the method according to the invention that the second layer of silicon dioxide (4) be removed isotropically in all directions. As a result, any material of the second layer, comprising stoichiometric silicon oxide (4), that is beneath the nanobridges defined in step II.G is removed. In addition, the structures defined in submethod I are partially exposed. The nanobridges are partially freely suspended above the silicon substrate (1) from this point in time onwards.

Submethod III: "Coating Method" Variant A

III.I The sample with the nanobridges and the partially exposed areas of the silicon substrate (1) is transferred into a molecular beam epitaxy system for deposition of the functional layers/structures. An ultrahigh vacuum of $p \leq 1 \times 10^{-9}$ hPa (e.g., $5 \times 10^{-10}$ hPa) is set. A topological insulator (6) of composition $(Bi_{0.06}Sb_{0.94})_2Te_3$ is deposited and grows selectively on the exposed substrate surface. The substrate rotation of 10 revolutions per minute guarantees that the aforementioned topological insulator also grows on the exposed subregions beneath the nanobridges.

III.J A thin layer of titanium nominally 2 nm thick (7) which is capable of forming a dense native oxidation layer is applied with substrate rotation in a surface-covering manner in the same molecular beam epitaxy system. Due to the substrate rotation, this layer is also deposited beneath the nanobridges. In the embodiment described here, the layer thickness of the titanium layer does not exceed the thickness of the native oxide of titanium and in subsequent steps, when outwardly transferred from the system, forms a passivation layer for the topological insulator in subregions.

III.K A further layer of 70 nm aluminum (8) is applied without substrate rotation to subregions of the previously deposited titanium layer (7). The nanobridges defined in the second layer (5) partially shadow the atomic/molecular flow.

In the present exemplary embodiment, selecting titanium as the second functional layer (7) proved to be advantageous since it can serve as an interdiffusion barrier between the first functional layer (6) and the third functional layer (8), but selecting a different superconductive metal, such as aluminum or niobium, as the third functional layer (8) since these metals have particularly advantageous superconductive properties with respect to titanium.

Submethod III: "Coating Method" Variant B

III.I The sample with the nanobridges and the partially exposed areas of the silicon substrate (1) is transferred into the ultrahigh vacuum (system-specifically, $p \leq 1 \times 10^{-9}$ hPa) of a molecular beam epitaxy system for deposition of the functional layers/structures. A Majorana material comprising $(Bi_{0.06}Sb_{0.94})_2Te_3$ is deposited and grows selectively on the exposed substrate surface. The substrate rotation of 10 $min^{-1}$ guarantees that the Majorana material also grows on the exposed subregions beneath the nanobridges.

After transfer within a so-called vacuum box (specifically, $p \leq 1 \times 10^{-8}$ hPa), the sample is transferred into a molecular beam epitaxy system for deposition of a layer of niobium nominally 70 nm thick (9). The layer is applied without substrate rotation to subregions of the second functional layer. The nanobridges defined in the second layer of stoichiometric silicon nitride (5) partially shadow the atomic/molecular flow.

The sample is transferred into an adjacent molecular beam epitaxy system without interrupting the vacuum. The layers (6) and (9) are thus held continuously in an inert atmosphere until the dielectric layer (10) is applied. A layer of stoichiometric $Al_2O_3$ 10 nm thick (10) is applied areally to the entire surface of the sample. The aluminum oxide is removed from a target of stoichiometric $Al_2O_3$. This layer serves to protect the surface and the surface states of the topological insulator between the subregions produced in process step III. J' and advantageously protects the Nb from oxidation.

Figure 5:
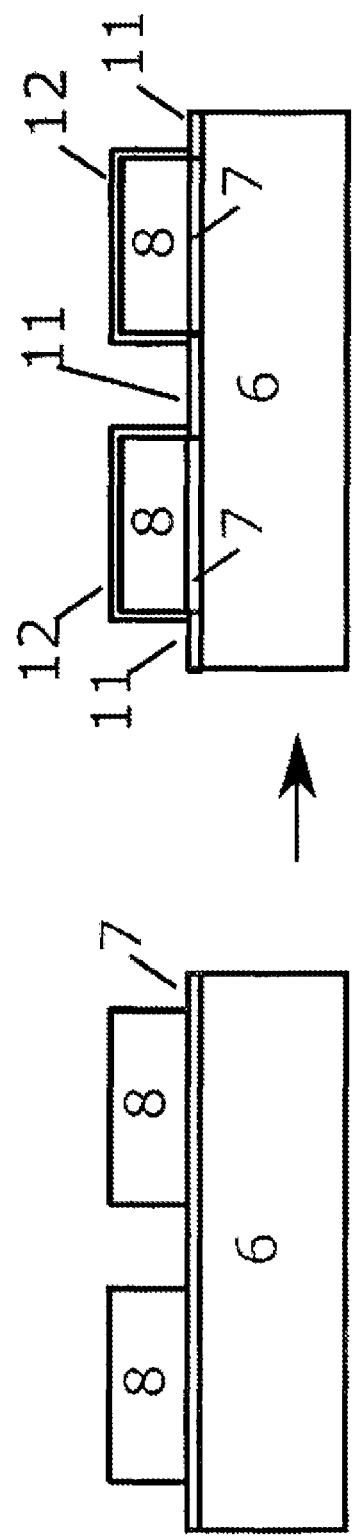
FIG. 5 illustrates the production, after outward transfer, of a Josephson junction according to an embodiment of the invention.
Figure 6:
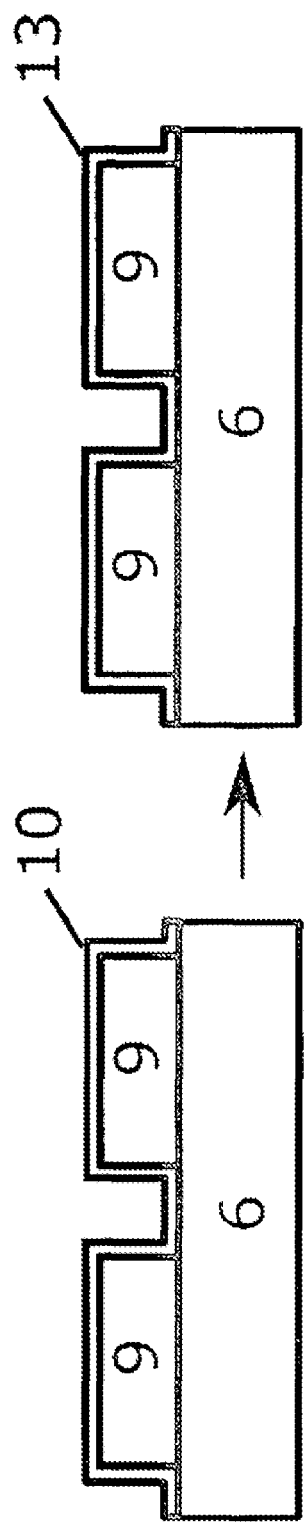
FIG. 6 illustrates the production, after outward transfer, of a Josephson junction according to an embodiment of the invention.

In FIGS. 5 and 6, the method steps for producing, after outward transfer, a Josephson contact for variants A and B are shown in addition to the illustrated method. In this case, the substrate (1) and the layers for the masks (2, 3, 4, 5) have been omitted for the sake of simplicity.

In variant A (FIG. 5), the structured Majorana material (6) with a second functional layer (7) arranged thereon and the two separately present regions of the third functional layer (8), each comprising a superconductive material, are present. Upon contact with atmospheric oxygen, not only the regions close to the surfaces of the two regions of the third functional layer (8), shown here as (12), but also the regions close to the surfaces of the exposed regions of the second functional layer (7), marked here as (11), oxidize. Because the layer thickness of the second functional layer (7) was chosen to be correspondingly thin, complete oxidation of the layer and thus the desired capping for the topological insulator (6) between the separately present regions (8) of the third functional layer takes place here (11), while the non-exposed regions of the first functional layer (7) which are in contact with the second functional layer (8) do not oxidize.

In variant B (FIG. 6), the structured Majorana material (6) is present with the two separately arranged regions of the second functional layer (9) and a third functional layer (10) formed thereon, each comprising a superconductive material. In this case, upon contact with atmospheric oxygen, only the region close to the surface of the third functional layer (10), shown here as (13), oxidizes. Since the layer thickness of the third functional layer (10) was chosen to be correspondingly thin overall, complete oxidation of the layer occurs here (13). As a result, the desired capping for the topological insulator (6) is achieved between the separately present regions (9) of the second functional layer. If the third functional layer (10) is an insulator, this layer (10) can be selected to have any thickness.

The hybrid structures produced according to the invention can advantageously be built up into complex networks. These networks include, for example, the topological Josephson contact as the smallest subunit but may in a further embodiment represent up to a plurality of topological quantum bits. The method according to the invention guarantees preservation of the surface properties of the structured Majorana material as a topological insulator, as well as a high interface quality between the structured Majorana material and the superconductor.

Figure 7:
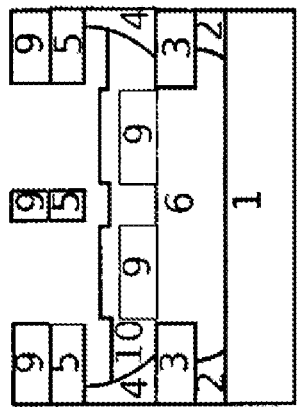
FIG. 7 illustrates plan views of Josephson junctions according to an embodiment of the invention.
Figure 7:
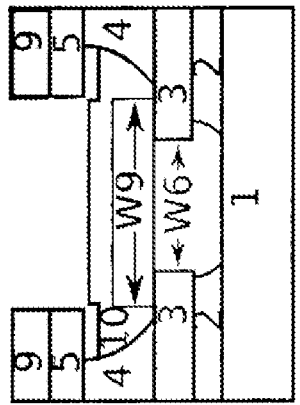
Figure 7:
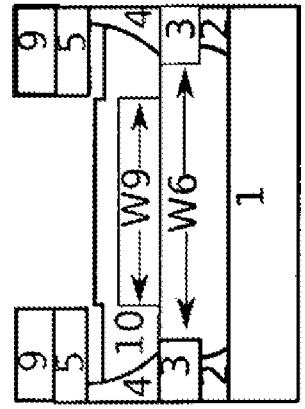
Figure 7:
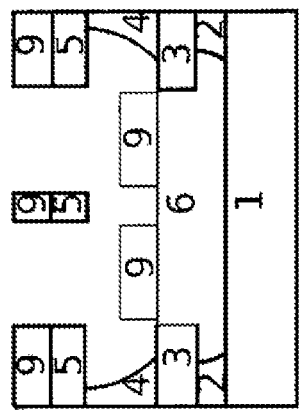
Figure 7:
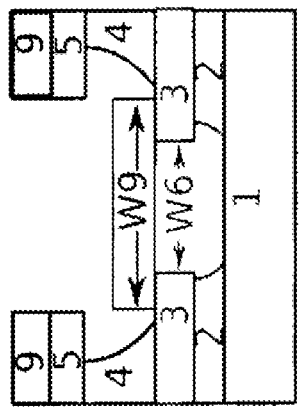
Figure 7:
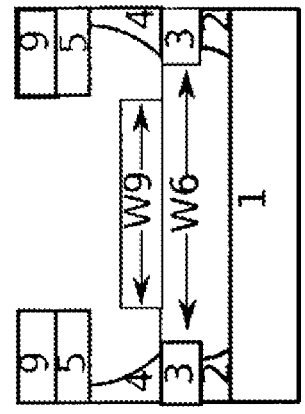
Figure 7:
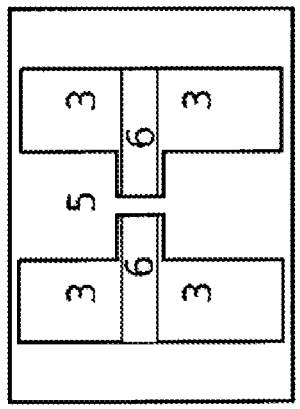
Figure 7:
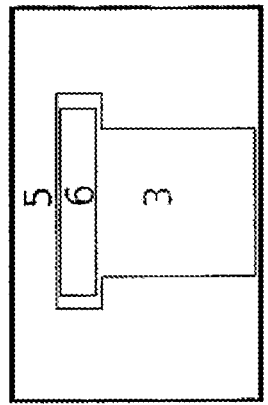
Figure 7:
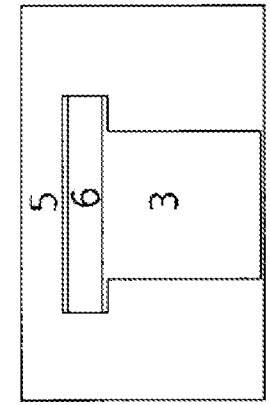

Further applications for the invention are shown in FIG. 7. Starting from method step I, in addition to a Josephson junction according to the invention with a topological insulator in wire form (6) (=G1), other geometries of Josephson junctions, such as a topological insulator in wire form (6) with a superconductive island (9), can also be produced (=G2), wherein the superconductive island (9) can cover the topological insulator completely (variant A) or only partially (variant B). In FIG. 7, the plan views after process step I are shown in the left column, the front views after process step J' in the middle column, and the front views after process step K' in the right column.

Figure 8:
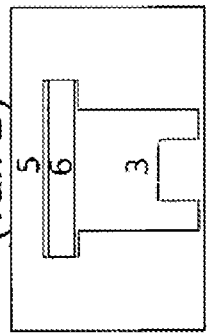
FIG. 8 illustrates plan views of Josephson junctions according to an embodiment of the invention.
Figure 8:
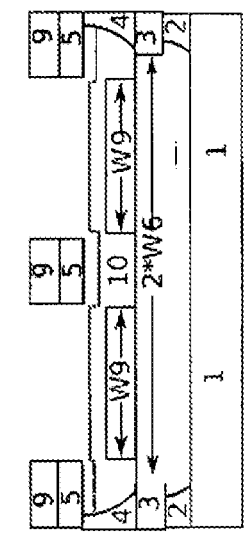
Figure 8:
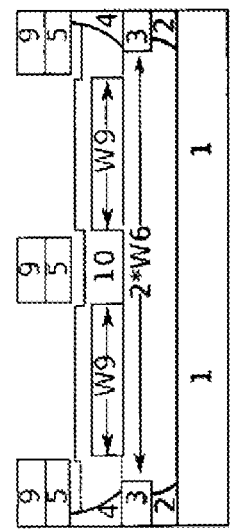
Figure 8:
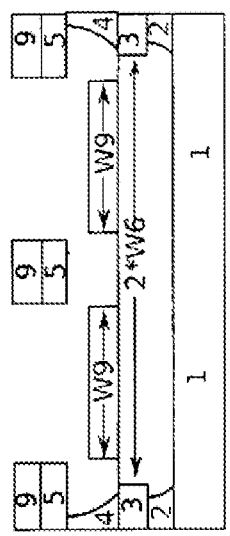
Figure 8:
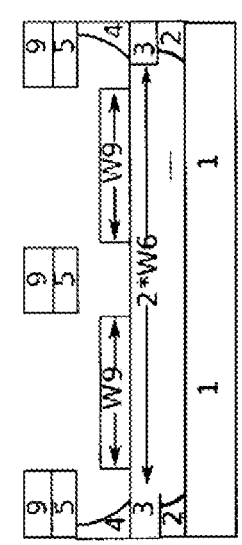
Figure 8:
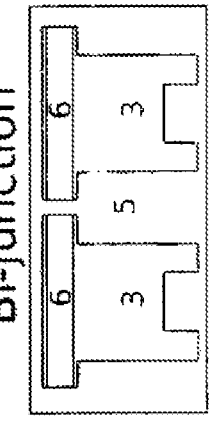
Figure 8:
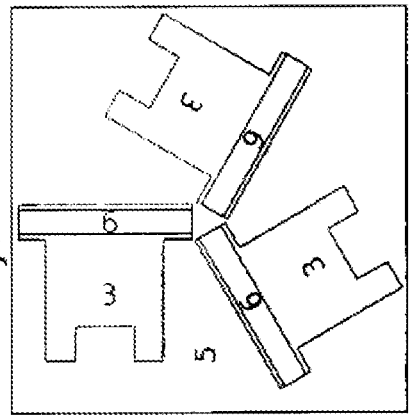

In particular, the Josephson junctions according to variant B can advantageously also be designed as a bi-junction and as a tri-junction, as shown in FIG. 8. In FIG. 8, the plan views after process step I are shown in the left column, the front views after process step J' in the middle column, and the front views after process step K' in the right column, in each case for the geometry G2 (variant B), see FIG. 7, as bi-junction and tri-junction.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LITERATURE CITED IN THIS APPLICATION

[1] https://arxiv.org/abs/1608.00263
"Characterizing Quantum Supremacy in Near-Term Devices," Sergio Boixo, Sergei V. Isakov, Vadim N. Smelyanskiy, Ryan Babbush, Nan Ding, Zhang Jiang, John M. Martinis and Hartmut Neven, arXiv: 1608.00263v2 [quant-ph] Aug. 3, 2016.

[2] http://iopscience.iop.Org/article/10.1070/1063-7869/44/10S/S29/meta:jsessionid=7B6A386E471815BB16B2CCDF05CF2B34.c3.io ps cience.cld.iop.org
"Unpaired Majorana fermions in quantum wires", A Yu Kitaev, Chernogolovka 2000: Mesoscopic and strongly correlated electron systems, Usp. Fiz. Nauk (Suppl.) 171 (10).

[3] http://science.sciencemaq.org/content/336/6084/1003
"Signatures of Majorana Fermions in Hybrid Superconductor-Semiconductor Nanowire Devices," V. Mourik, K. Zuo, S. M. Frolov, S. R. Plissard, E. P. A. M. Bakkers, L. P. Kouwenhoven, www.sciencemag.org SCIENCE VOL 336 May 25, 2012, 1003.

[4] https://arxiv.org/abs/1610.04555
"Experimental Phase Diagram of a One-Dimensional Topological Superconductor", Jun Chen, Peng Yu, John Stenger, Moira Hocevar, Diana Car, Sébastien R. Plissard, Erik P. A. M. Bakkers, Tudor D. Stanescu, Sergey M. Frolov, arXiv:1610.04555v1 [cond-mat.mes-hall] for this version).

[5] http://iournals.aps.org/prl/abstract/10.1103/PhysRevLett.116.257003
"Majorana Zero Mode Detected with Spin Selective Andreev Reflection in the Vortex of a Topological Superconductor," Hao-Hua Sun, Kai-Wen Zhang, Lun-Hui Hu, Chuang Li, Guan-Yong Wang, Hai-Yang Ma, Zhu-An Xu, Chun-Lei Gao, Dan-Dan Guan, Yao-Yi Li, Canhua Liu, Dong Qian, Yi Zhou, Liang Fu, Shao-Chun Li, Fu-Chun Zhang, and Jin-Feng Jia, Phys. Rev. Lett. 116, 257003, published Jun. 21, 2016

[6] http://www.nature.com/articles/ncomms10303
"4TT-periodic Josephson supercurrent in HgTe-based topological Josephson junctions," J. Wiedenmann, E. Bocquillon, R. S. Deacon, S. Hartinger, O. Herrmann, T. M. Klapwijk, L. Maier, C. Ames, C. Brune, C. Gould, A. Oiwa, K. Ishibashi, S. Tarucha, H. Buhmann, L. W. Molenkamp, Nat. Commun. 2016, 7, 10303.

[7] http://www.sciencedirect.com/science/article/pii/S002202481630Q847
"Selective area growth of $Bi_2Te_3$ and $Sb_2Te_3$ topological insulator thin films," Jörn Kampmeier, Christian Weyrich, Martin Lanius, Melissa Schall, Elmar Neumann, Gregor Mussler, Thomas Schäpers, Detlev Grützmacher, Journal of Crystal Growth, Volume 443, Jun. 1, 2016, pages 38-42.

[8] http://www.nature.com/nmat/journal/v14/n4/abs/nmat4176.html,
"Epitaxy of semiconductor-superconductor nanowires," P. Krogstrup, N. L. B. Ziino, W. Chang, S. M. Albrecht, M. H. Madsen, E. Johnson, J. Nygård, C. M. Marcus, T. S. Jespersen, Nature Materials, 14, 400-406 (2015) doi:10.1038/nmat4176.

[9] http://www.sciencedirect.com/science/article/pii/S01679317140Q3359
"Resistless nanofabrication by stencil lithography: a review," O. Vazquez-Mena, L. Gross, S. Xie, L. G. Villanueva, J. Brugger, Microelectronic Engineering, volume 132, Jan. 25, 2015, pages 236-254.

[10] http://www.sciencedirect.com/science/article/pii/S016793179900Q477
"Nonorganic evaporation mask for superconducting nanodevices," T. Hoss, C. Strunk, C. Schönenberger, Microelectronic Engineering, volume 46, issues 1-4, May 1999, 32

The invention claimed is:

1. A method for producing a hybrid structure, the hybrid structure including at least one structured Majorana material and at least one structured superconductive material arranged thereon, the method comprising:
   producing, on a substrate, a first mask for structured application of the Majorana material and a further mask for structured growth of the at least one superconductive material, the first mask and the further mask being aligned relative to one another; and
   applying the Majorana material to the substrate, wherein the first mask defines the structure of the Majorana material; and
   applying the at least one structured superconductive material to the structured Majorana material with the aid of the further mask,
   wherein the applying the Majorana material and the applying the at least one structured superconductive material is performed without interruption in an inert atmosphere.

2. The method according to claim 1, wherein the first mask and the further mask are produced according to the following steps:
   I.A applying a first additional layer to the substrate,
   I.B applying a second additional layer to the first additional layer, wherein the first additional layer is etchable selectively with respect to the second additional layer and the substrate,
   I.C structuring a surface of the second additional layer in such a way that at least one subregion of the second additional layer is exposed,
   I.D removing at least one exposed region of the first additional layer beneath the at least one exposed subregion of the second additional layer to the substrate, whereby an undercut occurs,
   II.E depositing a third additional layer such that the at least one exposed region of the first additional layer and the at least one exposed region of the second additional layer are completely filled and the third additional layer covers the second additional layer,
   II.F applying a fourth additional layer to the third additional layer, wherein the third additional layer is etchable selectively with respect to the fourth additional layer, the second additional layer and the substrate,
   II.G. structuring and exposing a surface of the fourth additional layer in such a way that a junction remains between at least two areas, and
   II.H removing regions of the third additional layer beneath exposed areas of the fourth additional layer, apart from the substrate, whereby a second undercut occurs,
   wherein the applying the Majorana material to the substrate comprises subsequently depositing the Majorana material on the substrate in a structured manner such that it is arranged within the at least one exposed region of the first additional layer and the at least one exposed region of the second additional layer.

3. The method according to claim 2, further comprising applying a functional layer to the structured Majorana material and at least partially to the exposed surface of the fourth additional layer.

4. The method according to claim 2, wherein, in step II.G., the surface of the fourth additional layer is structured and exposed in such a way that at least one trench having a length between 100 nm and 100 µm and a width between 10 nm and 10 µm is produced.

5. The method according to claim 2, wherein the first additional layer is applied with an overall layer thickness of between 1 nm and 20 nm.

6. The method according to claim 2, wherein the second additional layer is applied with an overall layer thickness of between 5 and 250 nm.

7. The method according to claim 2, wherein the first additional layer and the second additional layer are deposited with an overall layer thickness of between 15 and 50 nm.

8. The method according to claim 2, wherein the third additional layer is applied with an overall layer thickness of between 5 and 500 nm, preferably in the range of 10 to 150 nm.

9. The method according to claim 1, wherein the structured Majorana material includes Dirac materials.

10. The method according to claim 9, wherein the structured Majorana material includes $Bi_xSb_{1-x})_2(Te_ySe_{1-y})_3$, where $0 \leq x \leq 1$ and $0 \leq y \leq 1$.

11. The method according to claim 1, further comprising applying a material capable of forming a native oxidation layer to the structured Majorana material in a surface-covering manner with a layer thickness of between 1 and 3 nm, the structured Majorana material forming at least part of a first functional layer and the material capable of forming a native oxidation layer forming at least part of a second functional layer, and
   wherein a third functional layer comprising superconductive material is applied to subregions of the second functional layer without substrate rotation.

12. The method according to claim 11, wherein the second functional layer includes $Al_xO_y$, $Nb_xO_y$, $Ti_xO_y$, where $0 \leq x$, $y \leq 1$.

13. The method according to claim 11, wherein a further superconductive material is applied as the second functional layer.

14. The method according to claim 1, wherein the structured Majorana material forms at least part of a first functional layer, the method further comprising applying a second functional layer comprising a further superconductive material to subregions of the structured Majorana material without substrate rotation, and
   applying a third functional layer comprising an electrically insulating material to the second functional layer and a free surface of the first functional layer in a surface-covering manner.

15. The method according to claim 14, in the third functional layer includes at least an additional superconductive material.

* * * * *